United States Patent
Jones et al.

(10) Patent No.: US 6,598,177 B1
(45) Date of Patent: Jul. 22, 2003

(54) MONITORING ERROR CONDITIONS IN AN INTEGRATED CIRCUIT

(75) Inventors: Andrew M. Jones, Bristol (GB); William B. Barnes, Bristol (GB)

(73) Assignee: STMicroelectronics Ltd. (GB)

( * ) Notice: Subject to any disclaimer, the term of this patent is extended or adjusted under 35 U.S.C. 154(b) by 0 days.

(21) Appl. No.: 09/411,798

(22) Filed: Oct. 1, 1999

(51) Int. Cl.$^7$ .................................................. G06F 11/00
(52) U.S. Cl. .......................................... 714/30; 714/48
(58) Field of Search ............................. 714/30, 43, 48, 714/49, 53, 56

(56) References Cited

U.S. PATENT DOCUMENTS

| | | | |
|---|---|---|---|
| 4,814,981 A | 3/1989 | Rubinfeld | 364/200 |
| 5,251,311 A | 10/1993 | Kasai | 395/425 |
| 5,261,084 A | * 11/1993 | Hashiguchi et al. | 395/575 |
| 5,386,565 A | 1/1995 | Tanaka et al. | 395/700 |
| 5,423,050 A | 6/1995 | Taylor et al. | 395/575 |
| 5,434,804 A | 7/1995 | Bock et al. | 364/579 |
| 5,440,705 A | 8/1995 | Wang et al. | 395/421.1 |
| 5,444,722 A | * 8/1995 | Tran | 395/183.18 |
| 5,448,576 A | 9/1995 | Russell | 371/22.3 |
| 5,452,432 A | 9/1995 | Macachor | 395/425 |
| 5,455,936 A | 10/1995 | Maemura | 395/183.11 |
| 5,479,652 A | 12/1995 | Dreyer et al. | 395/183.06 |
| 5,483,518 A | 1/1996 | Whetsel | 370/13 |
| 5,488,688 A | 1/1996 | Gonzales et al. | 395/183.1 |

(List continued on next page.)

FOREIGN PATENT DOCUMENTS

| | | | |
|---|---|---|---|
| EP | 0165600 B1 | 11/1991 | G06F/13/36 |
| EP | 0636976 B1 | 2/1995 | G06F/11/00 |
| EP | 0636976 A1 | 2/1995 | G06F/11/00 |
| EP | 0652516 A1 * | 5/1995 | G06F/11/00 |
| EP | 0702239 A2 | 3/1996 | G01R/31/3173 |
| EP | 0720092 A1 | 7/1996 | G06F/11/00 |
| EP | 0933926 A1 | 8/1999 | H04N/5/00 |
| EP | 0945805 A1 | 9/1999 | G06F/12/08 |
| EP | 0959411 A1 | 11/1999 | G06F/13/24 |
| JP | PCT/JP96/02819 | * 9/1996 | G06F/9/46 |
| JP | 8320796 A | 12/1996 | G06F/9/46 |
| JP | 8329687 A | 12/1996 | G11C/15/00 |
| JP | 9212358 A | 8/1997 | G06F/9/38 |
| JP | 9311786 A | 12/1997 | G06F/9/38 |
| JP | 10106269 A | 4/1998 | G06F/12/08 |
| JP | 10124484 A | 5/1998 | G06F/17/10 |
| JP | 10177520 A | 6/1998 | G06F/12/10 |

Primary Examiner—Robert Beausoliel
Assistant Examiner—Marc Duncan
(74) Attorney, Agent, or Firm—Lisa K. Jorgenson; William A. Munck (57) ABSTRACT

The invention relates to monitoring error conditions in an integrated circuit. The integrated circuit has a packet router to which a plurality of functional modules are connected between which packets are transmitted. Each functional module is associated with an error monitoring register for monitoring error conditions. The error monitoring register contains a plurality of error flags which can be set when a particular error condition is detected. The invention particularly but not exclusively relates to the setting of communication error flags relating to errors in communication of the packet.

21 Claims, 4 Drawing Sheets

U.S. PATENT DOCUMENTS

| | | | |
|---|---|---|---|
| 5,490,250 A | * 2/1996 | Reschke et al. | 375/185.01 |
| 5,530,965 A | 6/1996 | Kawasaki et al. | 395/800 |
| 5,570,375 A | 10/1996 | Tsai et al. | 371/22.3 |
| 5,590,278 A | * 12/1996 | Barthel et al. | 395/185.06 |
| 5,590,354 A | 12/1996 | Klapproth et al. | 395/800 |
| 5,596,734 A | 1/1997 | Ferra | 395/825 |
| 5,598,551 A | 1/1997 | Barajas et al. | 395/484 |
| 5,608,881 A | 3/1997 | Masumura et al. | 395/306 |
| 5,613,153 A | 3/1997 | Arimilli et al. | 395/821 |
| 5,627,842 A | 5/1997 | Brown et al. | 371/22.3 |
| 5,644,709 A | * 7/1997 | Austin | 395/185.06 |
| 5,657,273 A | 8/1997 | Ayukawa et al. | 395/189.01 |
| 5,682,545 A | 10/1997 | Kawasaki et al. | 395/800 |
| 5,704,034 A | 12/1997 | Circello | 395/183.14 |
| 5,708,773 A | 1/1998 | Jeppesen, III et al. | 395/183.06 |
| 5,724,549 A | 3/1998 | Selgas et al. | 395/468 |
| 5,737,516 A | 4/1998 | Circello et al. | 395/183.14 |
| 5,751,621 A | 5/1998 | Arakawa | 364/748.07 |
| 5,761,413 A | * 6/1998 | Frank et al. | 395/185.02 |
| 5,768,152 A | 6/1998 | Battaline et al. | 364/551.01 |
| 5,771,240 A | 6/1998 | Tobin et al. | 371/22.1 |
| 5,774,701 A | 6/1998 | Matsui et al. | 395/556 |
| 5,778,237 A | 7/1998 | Yamamoto et al. | 395/750.04 |
| 5,781,558 A | 7/1998 | Inglis et al. | 371/21.1 |
| 5,793,949 A | * 8/1998 | Yusuki et al. | 395/185.01 |
| 5,796,978 A | 8/1998 | Yoshioka et al. | 395/416 |
| 5,828,825 A | 10/1998 | Eskandari et al. | 395/183.03 |
| 5,832,248 A | 11/1998 | Kishi et al. | 395/376 |
| 5,835,963 A | 11/1998 | Yoshioka et al. | 711/207 |
| 5,848,247 A | 12/1998 | Matsui et al. | 395/284 |
| 5,860,127 A | 1/1999 | Shimazaki et al. | 711/167 |
| 5,862,387 A | 1/1999 | Songer et al. | 395/728 |
| 5,867,726 A | 2/1999 | Ohsuga et al. | 395/800.32 |
| 5,884,023 A | * 3/1999 | Swoboda et al. | 395/183.06 |
| 5,884,092 A | 3/1999 | Kiuchi et al. | 395/800.35 |
| 5,896,550 A | 4/1999 | Wehunt et al. | 395/846 |
| 5,918,045 A | 6/1999 | Nishii et al. | 395/584 |
| 5,930,523 A | 7/1999 | Kawasaki et al. | 395/800.32 |
| 5,930,833 A | 7/1999 | Yoshioka et al. | 711/210 |
| 5,944,841 A | 8/1999 | Christie | 714/38 |
| 5,950,012 A | 9/1999 | Shiell et al. | 395/712 |
| 5,953,530 A | * 9/1999 | Rishi et al. | 395/704 |
| 5,953,538 A | 9/1999 | Duncan et al. | 395/842 |
| 5,956,477 A | 9/1999 | Ranson et al. | 395/183.06 |
| 5,978,874 A | 11/1999 | Singhal et al. | 710/107 |
| 5,978,902 A | 11/1999 | Mann | 712/227 |
| 5,983,017 A | 11/1999 | Kemp et al. | 395/704 |
| 5,983,379 A | 11/1999 | Warren | 714/727 |
| 6,009,542 A | * 12/1999 | Koller et al. | 714/53 |
| 6,195,770 B1 | * 2/2001 | Walton | 714/53 |
| 6,334,193 B1 | * 12/2001 | Buzsaki | 714/2 |

* cited by examiner

MONITORING ERROR CONDITIONS IN AN INTEGRATED CIRCUIT

FIELD OF THE INVENTION

The present invention relates to the monitoring of error conditions in an integrated circuit. The invention is particularly but not exclusively concerned with monitoring errors arising in the transmission of packets routed between functional modules via an on-chip communication path.

BACKGROUND TO THE INVENTION

Integrated circuits are becoming increasingly highly embedded. It is now possible to integrate on a single chip a number of functional modules including for example a high performance CPU with a plurality of additional complex modules, linked together using a high performance bus. In the past, such complex systems were constructed from discrete components on a printed circuit board. It was possible to track errors by physically attaching probes from a logic analyser to the bus on the printed circuit board and observing the behaviour. For highly integrated systems on a single chip, physical access to the bus is impractical. For debugging purposes, it is highly advantageous to be able to monitor certain error conditions concerning transmission of packets on the bus without interfering with the transmission of those packets and without the need for running complex debugging software.

SUMMARY OF THE INVENTION

According to one aspect of the invention there is provided an integrated circuit comprising: a plurality of functional modules interconnected via an on-chip communication path, each functional module having packet handling circuitry for generating and receiving packets conveyed by the communication path, wherein each functional module is associated with an error monitoring register for monitoring error conditions and wherein the packet handling circuitry includes error detection logic for detecting an error condition and flagging the error condition in the error monitoring register.

Another aspect of the invention provides a functional module having an interface for connection to a packet router, the functional module having packet handling circuitry for generating and receiving packets conveyed by the packet router across said interface, wherein the packet handling circuitry includes error detection logic for detecting an error condition in packets conveyed by the packet router and setting one or more of a set of communication error flags in an error monitoring register implemented at the functional module.

A still further aspect of the invention provides a method of monitoring errors arising in the transmission of packets conveyed by a packet router interconnecting a plurality of functional modules wherein each functional module has packet handling circuitry for generating and receiving packets, the method comprising: at each functional module, monitoring the receipt of packets conveyed by the packet router to that functional module, determining the nature of the received packet amongst the group of packet types including a memory access request packet, an ordinary response packet and an error response packet, in the case of receipt of a memory access request packet, checking whether the memory access request packet conveys a valid request for that functional module and, if so, generating an ordinary response packet and, if not, generating an error response packet, and in the case of generation of an error response packet, setting a communication error flag at the functional module to denote that an error response packet has been generated.

Another aspect of the present invention provides a method of monitoring errors arising in the transmission of packets conveyed by a packet router interconnecting a plurality of functional modules wherein each functional module has packet handling circuitry for generating and receiving packets, the method comprising: at each functional module, monitoring the receipt of packets conveyed by the packet router to that functional module, determining the nature of the received packet amongst the group of packet types including a memory access request packet, an ordinary response packet and an error response packet, in the case of receipt of an error response packet, setting a communication error flag at the functional module to denote that an error response packet has been received.

Another aspect of the present invention provides a method of monitoring errors arising in the transmission of packets conveyed by a packet router interconnecting a plurality of functional modules wherein each functional module has packet handling circuitry for generating and receiving packets, the method comprising: at each functional module, monitoring the receipt of packets conveyed by the packet router to that functional module. Determining the nature of the received packet amongst the group of packet types including a memory access request packet, an ordinary response packet and an error response packet, in the case of receipt of a memory access request packet, identifying at least one of the destination and function of the memory access request packet and setting a communication error flag at the functional module if the destination or the function of the memory access request packet is in error.

Thus, according to the main concept underlying the above aspects of the invention, each functional module responds to an error condition by setting an error flag. Additionally it is possible for the functional module to generate an error response packet to indicate to the source module of a requesting packet that a request has been made in error. In the described embodiment, a register at each functional module records the transmission and reception of error response packets, and also allows a number of additional error conditions to be flagged.

Furthermore, in the described embodiment, the registers are memory mapped to enable debuggers to observe the identify of all modules which participate in the transmission or receipt of error response packets. Thus, it is possible to carry out a memory scan of the on-chip memory space to locate flagged error conditions.

The packets conveyed via the communication path or packet router can include memory access request packets and response packets. The packet handling circuitry can be operable to generate ordinary response packets in the case that a valid memory access request has been received, and error response packets in the case that an invalid memory access request has been received.

The error condition flags can be read or written by such memory access request packets, which can be-generated on or off-chip. One of the functional modules can be arranged to provide an off-chip communication link connectable to a host computer particularly for debugging purposes.

The integrated circuit can be supplied with a common memory space of which the error monitoring registers form part. The memory space can include a plurality of control blocks associated respectively with the functional modules, each control block comprising a plurality of control registers including the error monitoring register for each functional module.

A number of different communication error flags can be provided.

An error response received communication error flag can be set when an error response packet has been received.

An error response sent communication error flag can be set when an error response packet has been generated.

Other communication error flags can be used to monitor errors received in the request packets themselves. For example, if the destination or function defined in a memory access request packet is in error with respect to that functional module, particular communication error flags can be set.

An unsolicited response communication error flag can be set in the case that an unsolicited response packet has been received at a particular functional module.

For a better understanding of the present invention and to show how the same may be carried into effect reference will now be made to the following drawings.

DESCRIPTION OF THE PREFERRED EMBODIMENTS

Figure 1:
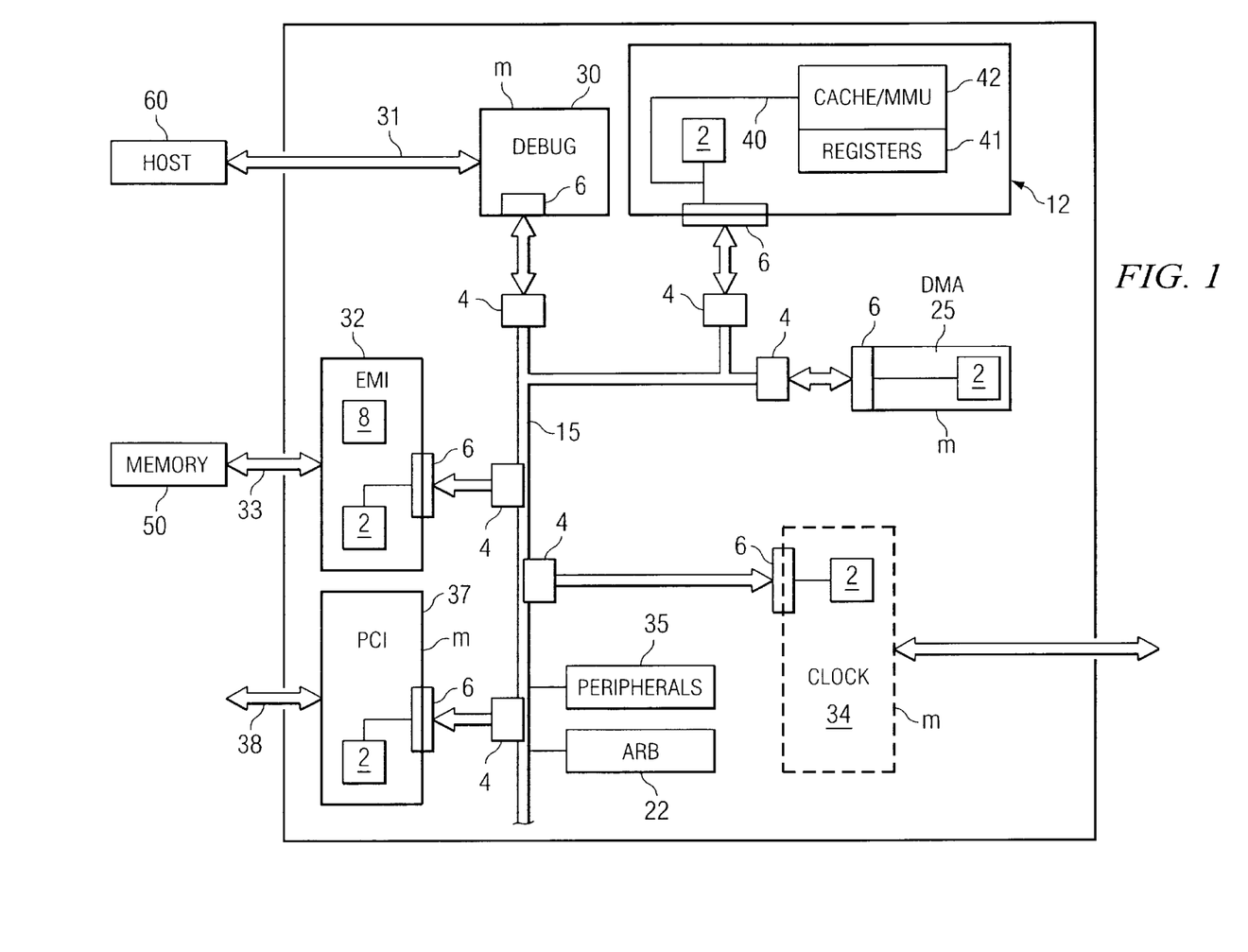
FIG. 1 is a block diagram of a processor embodied as an integrated circuit with an external memory.

FIG. 1 illustrates an integrated circuit according to an embodiment of the invention. On each chip 11 a CPU unit 12 is connected to a plurality of modules M by a data and address path 15 arranged to carry bit packets in parallel form. The modules as well as the CPU unit 12 each include packet handling circuitry 2 used in the generation and receipt of bit packets on the path 15. The path 15 is referred to herein as a packet router or routing bus. Two main types of packet are used on the data and address path 15, each including a destination indicator or address to indicate the required destination module connected to the path 15. The packets include request packets which are generated by an initiator module and response packets which are generated by a target module. A module may act as both an initiator and a target. Response packets are of two types, ordinary responses or error responses. These are discussed in more detail later. The modules M as well as the CPU unit 12 each packet handling circuitry 2 for handling packet formation and receipt requests, ordinary responses and error responses.

The routing bus 15 provides bi-directional connections to each module. In this example the bus consists of parallel request and response buses and a dedicated control bus provided respectively for each module so as to link the module to an arbitration unit 22. Each module is connected to the routing bus via a port 4 and is provided with an interface 6 incorporating a state machine so as to interchange control signals and data between the port 4 and the interface 6.

Figure 1A:
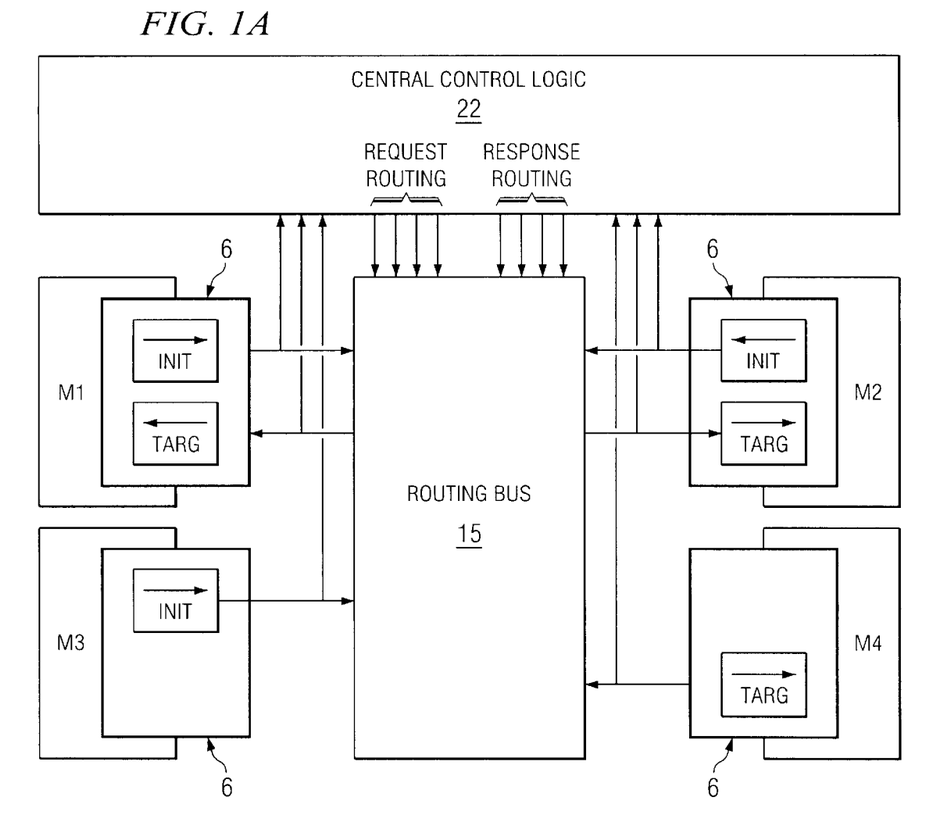
FIG. 1A is a block diagram illustrating initiator and target modules.

FIG. 1A is a block diagram illustrating relevant functional components of the chip of FIG. 1 to illustrate the concept of targets and initiator modules. The modules are labelled M1, M2, M3 and M4 and may include any of the modules M already described with reference to FIG. 1. Modules M1 and M2 both have target and initiator functions as illustrated by the separate target and initiator parts of the interface 6 of each module. Module M3 acts only as an initiator and module M4 acts only as a target. Signals from the interfaces 6 are supplied to central control logic which forms part of the arbitration unit 22. The arbitration unit 22 issues request routing controls and response routing controls to the routing bus network 15.

In the example shown in FIG. 1, the various modules M include a debug module 30 which includes an external link 31 for transmitting packets across the chip boundary, an external memory interface EMI 32 having an external bus connection 33 leading to an external memory 50, clock circuitry 34, various peripheral interfaces 35, a peripheral component interface PCI 37 with an external connection 38, a DMA unit 25 for effecting memory accesses as well as the arbitration unit 22. The CPU unit 12 includes a plurality of instruction execution units 40, a plurality of registers 41, and a cache 42. The CPU unit 12 also includes packet handling circuitry 2 connected to the execution units 40. The routing bus 15 is arranged to transmit to the modules M both request and response packets for effecting memory access transactions as discussed further herein. These packets may be generated by software as a result of instruction execution by a CPU or by hardware responsive to detection of a packet. The packets may be generated on-chip and distributed on the bus 15 or generated off-chip and supplied to the on-chip bus 15 through an external connection such as the link 31 associated with the debug module 30.

The CPU can be operated in a conventional manner receiving instructions from a program memory and effecting data read or write operations with the cache 42 on-chip. Additionally external memory accesses for read or write operations may be made through the external memory interface 32 and bus connection 33 to the external memory 50.

The debug module 30 provides an important external communication which may be used for example in debugging procedures. The on-chip CPU 12 may obtain instruction code (by memory access packets) for execution from an external source such as a debugging host 60 communicating through the link 31. Communications on the routing bus 15 are carried out in bit parallel format. It is possible to reduce the parallelism of packets obtained from the routing bus 15 so that they are output in bit serial format through the link 31.

Each packet is constructed from a series of cells or tokens, the end of the packet being identified by an end of packet (eop) signal. The construction of the cells is discussed in more detail later. Briefly, each packet cell comprises a number of fields which characterise the packet. Each packet is transmitted by a source module and is directed to a destination module. An initiator can issue request packets and act on response packets. A target can receive and act on requests and issue responses. Thus, a source module may be an initiator or a target depending on the nature of the packet. The source module uses its associated port 4 to transmit a packet onto the routing bus 15. The routing bus 15 arranges for the packet to be routed to the port associated with the destination module. The destination module then receives that packet from its associated port. The source and destination modules can be the same.

Figure 2:
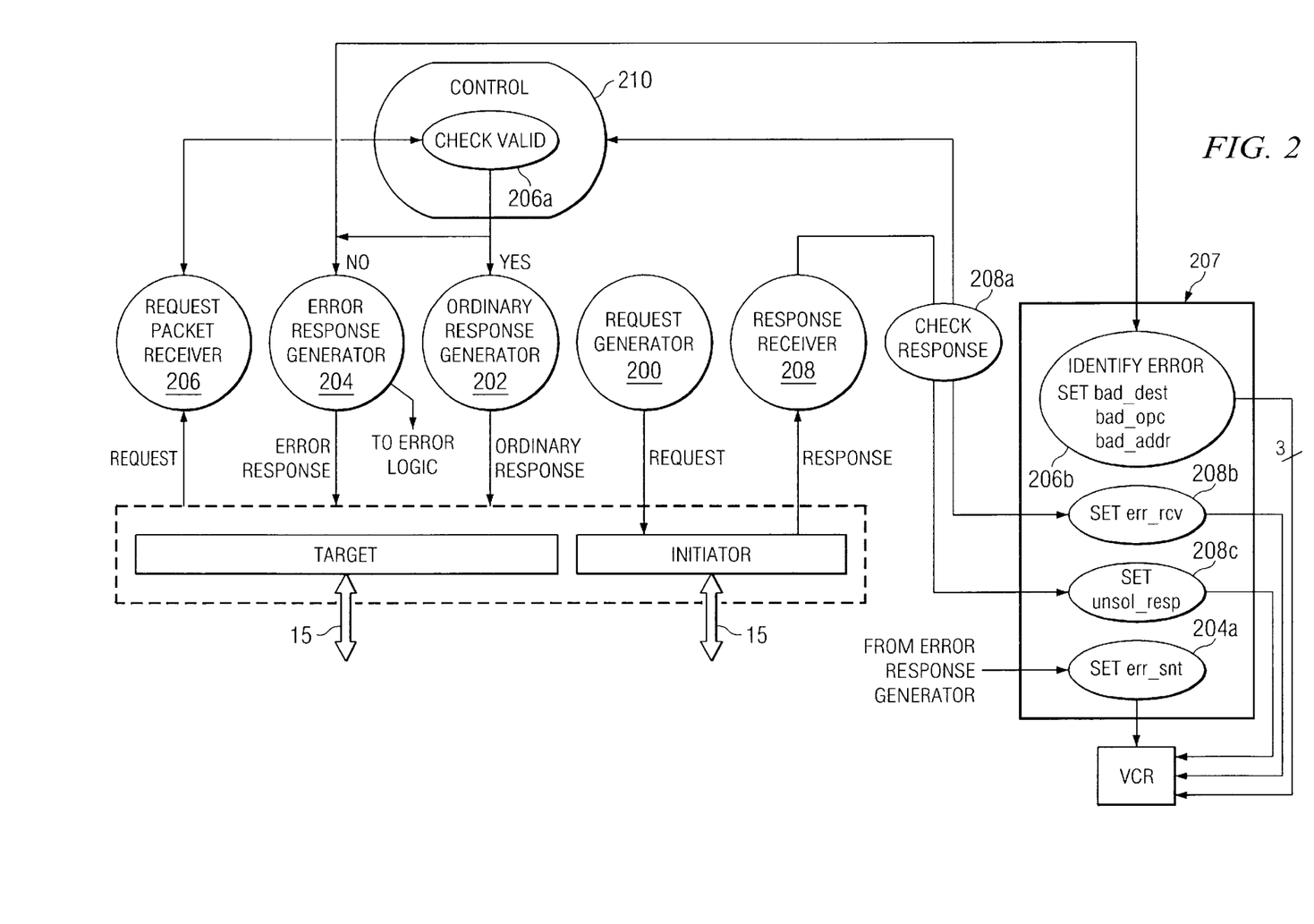
FIG. 2 shows the packet handling logic.

A transaction is an exchange of packets that allows a module to access the state of another module. A transaction consists of the transfer of a request packet from a source module to a destination module, followed by the transfer of a response packet from that destination module (now acting as a responding module) back to the source module which made the original request. The request packet initiates a transaction and its contents determine the access to be made. The response packet completes the transaction and its contents indicate the result of the access. A response packet also indicates whether the request was valid or not. If the request was valid, a so-called ordinary response packet is sent. If the request was invalid, an error response packet is transmitted. Some modules act only as initiators and thus their packet handling circuitry 2 is capable only of the generation of request packets. Some modules act only as targets, and therefore their packet handling circuitry 2 is capable only of generating response packets. In that case, both ordinary responses and error responses can be generated. However, some modules are capable of acting both as initiators or as targets, and their packet handling circuitry is capable of generating both request and response type packets. A logic diagram for the relevant parts of a module capable of both these functions is shown in FIG. 2. The packet handler 2 comprises request generator logic 200, ordinary response generator logic 202, error response generator logic 204, request packet receiver logic 206, response packet receiver logic 208, and error detection logic 207. These are all under the general functional control of a control logic block 210. A request packet is constructed by a requesting module when that module needs to make an access to a particular target module. As discussed more fully later, the address of the target module is recorded in the request packet destination field. The requesting module acts as a source of the request packet and sends that packet into the routing bus 15. The routing bus 15 arranges for that request packet to be routed from its source to its destination. The destination receives the request packet from the routing bus 15. The request packet receiver logic 206 checks whether or not the request is valid at 206a. If it is valid, an ordinary response packet is generated by the ordinary response generator logic 202 and the module services the requested access according to the information in the received request packet. If the request is not valid, the error response generator logic 204 generates an error response packet and sets an error flag as indicated at 204a and discussed more fully hereinafter. In addition, particular errors in the request can be identified by error detector 206b in the error detection logic.

A response packet (ordinary or error) is constructed in order to reply to the request packet. The module which originated the request packet is recorded in the response packet's destination field. This is discussed more fully later. The responding module is the source of the response packet and sends that packet onto the routing bus 15. This is done by the module interface 6. The response receiver logic 208 receives the response packet from the routing bus 15 and checks the response at 208a. If the response can be matched to the original request, the transaction is completed. If an error response has been received, an error flag is set as indicated at 208b and discussed more fully hereinafter. If an unsolicited response has been received, an error flag is set at 208c.

Figure 3:
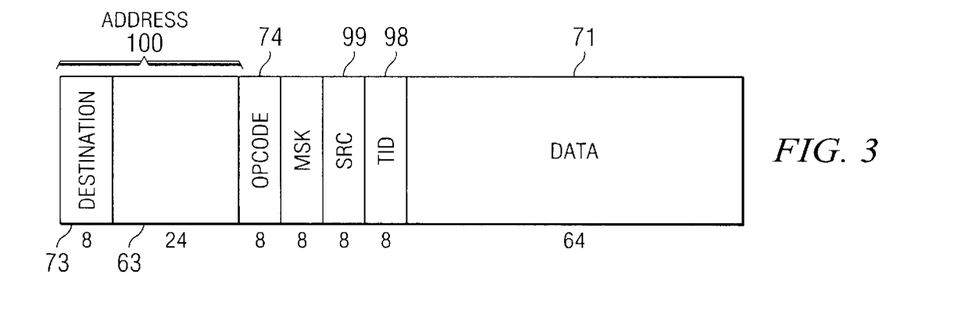
FIGS. 3 and 4 are packet formats of request and response packets respectively conveyed by a communication path of the processor.
Figure 4:
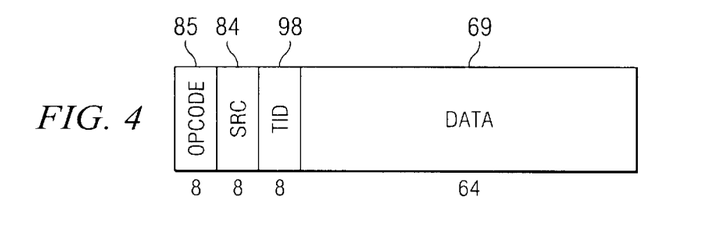

The format of the multibit packets used on the routing bus 15 in the microcomputer are illustrated by way of example in FIGS. 3 and 4. FIG. 3 shows, the information carried by each request cell.

Each packet is constructed from a series of cells framed using an end of packet (EOP) signal. Each request cell comprises a 32-bit address field which indicates the destination address of the packet. In the described embodiment, an address comprises an 8-bit destination field 73 followed by a 24-bit offset field 63 which identifies a memory location within the destination. The offset information is present in request packets to identify the particular memory location at which the request is targeted. The destination field 73 is a 1-byte field used to route the packet to the destination or target module. A byte 74 conveys the opcode which identifies the nature of the requested access. For example, the opcode can define a load word access for reading a register value and a store word access for writing a register value. The basic kinds of memory operation supported by the transactions are read, write, atomic read-modify-write and swap. A SRC byte 99 is a source field which identifies the source module and which is used as a return address for a response packet. A TID byte 98 conveys a transaction identifier which is used by the requester to associate responses with requests. The TID enables a module to identify response packets corresponding to respective request packets in cases where a plurality of request packets have been sent before response packets have been received for each request packet. A 64-bit data field 71 holds data to be conveyed with the request.

FIG. 4 illustrates the construction of a response packet cell. If the response packet contains more information than a single cell, it is constructed from a sequence of cells framed using a response end of packet (R_EOP) signal. The response packet includes an opcode byte 85 which denotes the nature of the requested transaction, a byte 84 which identifies the source module of the requesting packet which gave rise to the response and which acts as the return address for the response packet, a transaction identifier 98 and a data field 69.

The opcode field 74 of a request packet has a number of different possible encodings to define the nature of the requested access. Bit 7 of the opcode is used to identify whether it is a request or a response packet however. With bit 7 set to one, the packet is a response and which bit 7 set to zero, the packet is a request. The opcode field 85 of the response packet thus has bit 7 set to one in each case. In addition, bit 0 is set to zero if the response is a ordinary response (successful transaction), and is set to one if it is an error response. Thus, the opcode field can quickly and readily identify whether a packet is a request or a response and whether the response is an ordinary response or an error response.

When a module has a packet to send to another module, for example from the CPU unit 12 to the EMI module 32, it first signals this by asserting a request signal to a dedicated line connecting that module (12) to the central arbitration unit 22. It also outputs an eight bit signal (DEST) on a destination bus to indicate to the arbitration unit 22 the intended destination of the packet it wishes to transmit. A module M which is able to receive a packet from the routing bus 15 will assert a "grant receive" signal to the central arbitration unit 22 regardless of whether a packet is available to be fed to that destination or not. When the central arbitration unit 22 determines that a module wishes to send a packet to a destination and independently the destination has indicated that it is able to receive a packet from the bus 15, the unit 22 arranges for the transfer to take place. The unit 22 asserts a "grant send" signal to the appropriate interface 6 causing the sending module to put the packet onto the bus 15. The arbitration unit 22 then asserts a "send" signal which signals to the receiving module that it should accept the transfers currently on the bus 15. The packet transmission concludes when the sender asserts an "end of packet send" signal concurrently with the last transfer of packet data on the bus 15. The control asserts an "end of packet received" signal to the receiving module which causes it to cease accepting data on the bus 15 after the current transfer has been received.

The chip described herein has distributed memory arranged in a common memory space. The memory addressing semantics are discussed later. Registers can be implemented as memory mapped registers which can be located in on-chip RAM, at each module or in the off-chip memory 50. However, in the described embodiment it is assumed that the version control registers discussed later are physically implemented within the modules M to which they apply. Thus, registers are addressed by identifying the destination module using the DEST byte 73 in a request packet and then by identifying the specific offset within that module using the 24-bit address in the address field 100.

Each module has associated with it three types of memory block: control block CB, data block DB and undefined blocks UB. Each memory block holds $2^{24}$ bytes and the addressing semantics are such that a block can be considered as being located between offset 0 and offset $2^{24}$. This is illustrated diagrammatically in FIG. 5.

Each module is associated with a single control block. Each control block holds a plurality of control registers labelled CR and VCR in FIG. 5. In the described embodiment, each control block contains $2^{21}$ 8 byte registers. The control registers labelled VCR are version control registers. Each control block has one version control register. The contents of the version control registers are explained later.

Figure 5:
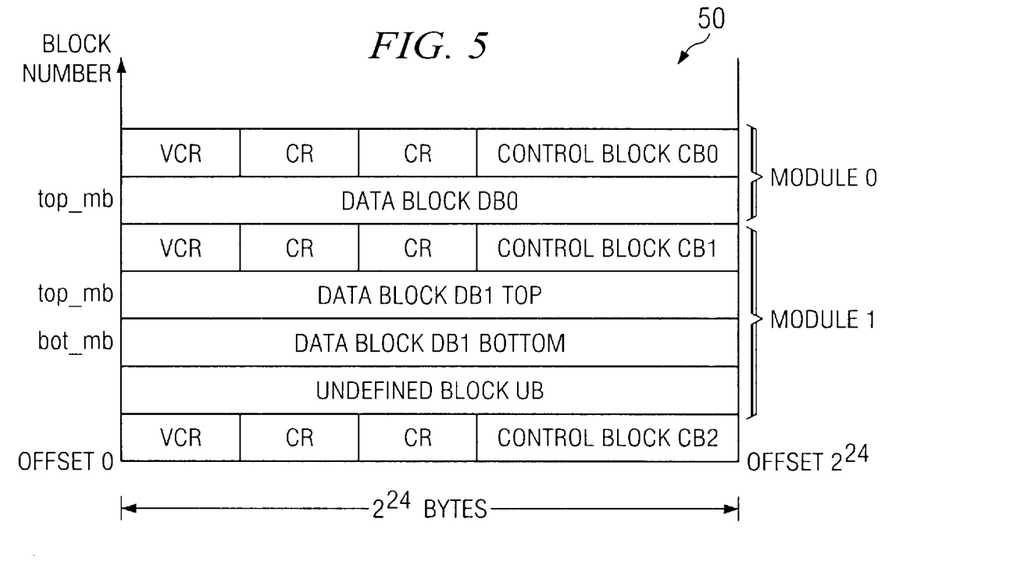
FIG. 5 is a diagrammatic illustration of the memory layout.

In addition each module is associated with zero, one or more data blocks. Each data block is a contiguous range of data memory blocks, and the set of data blocks associated with a module are contiguous in physical address space. In FIG. 5, module 0 is shown as associated with a control block CB0 and a single data block DB0. Module 1 is shown associated with a control block CB1 and two data blocks DB1top, DB1bot. In addition module 1 is shown as having an undefined block UB. An undefined block is merely a block which is neither a control block nor a data block. Any attempted access to an undefined block is an error which is handled as described in the following.

The layout of the physical memory map is such that each control block contains its version control register VCR at offset 0. In general each control block is allocated at a higher address than its data block. In FIG. 5, the address is shown as an increase in block number moving upwards in FIG. 5. Of course the precise addressing scheme will depend on the actual implementation of the memory and its accessing scheme.

Figure 6:
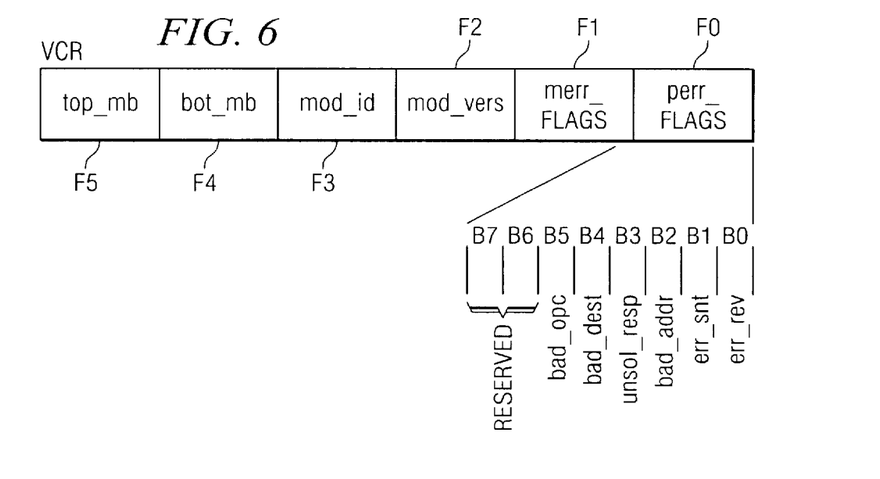
FIG. 6 illustrates the fields of a version control register.

The control registers are memory mapped registers in the control blocks. Control registers in the described embodiment are 64 bits wide and are allocated on addresses that are 8 byte aligned. Control registers can be read using a whole word LoadWord transaction and written using a whole word StoreWord transaction using packet types as herein defined. Of particular interest in this case are the version control registers. Each version control register contains a plurality of fields F0 to F5 as indicated in FIG. 6. Fields F0, F1, F4 and F5 are 8 bits long and fields F2 and F3 are 16 bits long. Table I illustrates the VCR format of FIG. 6. Because the version control register is located at offset 0 of every control block for the module that implements that control block, the physical address of a control block is the same as the physical address of the version control register in that control block.

TABLE I

| MODULE.VCR | | | | | |
|---|---|---|---|---|---|
| Field | Bits | Size | Vola-tile? | Synopsis 0x000000 | Type |
| perr_flags | [0,7] | 8 | ✓ | P-port error flags | Varies |
| | Operation | | | identifies communication errors | |
| | When read | | | returns current value | |
| | When written | | | bit specific action | |
| | HARD reset | | | 0 | |
| merr_flags | [8,15] | 8 | ✓ | P-module error flags (module specific) | Varies |
| | Operation | | | identifies module errors | |
| | When read | | | returns current value | |
| | When written | | | bit specific action | |
| | HARD reset | | | 0 | |
| mod_vers | [16,31] | 16 | — | Module version | RO |
| | Operation | | | Used to indicate module version number | |
| | When read | | | Returns MOD_Vers | |
| | When written | | | Ignored | |
| | HARD reset | | | MOD_VERS | |
| mod_id | [32,47] | 16 | — | Module identity | RO |
| | Operation | | | Used to identity module | |
| | When read | | | Returns MOD_ID | |
| | When written | | | Ignored | |
| | HARD reset | | | MOD_ID | |
| bot_mb | [48,55] | 8 | — | Bottom memory block | RO |
| | Operation | | | Used to identify bottom memory block | |
| | When read | | | Returns BOT_MB | |
| | When written | | | Ignored | |
| | HARD reset | | | BOT_MB | |
| top_mb | [56,63] | 8 | — | Top memory block | RO |
| | Operation | | | Used to identify top memory block | |
| | When read | | | Returns TOP_MB | |
| | When written | | | Ignored | |
| | HARD reset | | | TOP_MB | |

The version control registers of different modules have a common layout. This allows software to parse a VCR value without knowledge of the implementation of the module that provided the VCR.

As illustrated in FIG. 6, the version control register for each module contains the following fields:

F0 perr_flags: this field contains packet error flags (p-error flags) which report the error status of the interface between this module and the routing bus 15. The set of supported flags and their standard semantics are described later.

F1 merr_flags: this field contains module specific error flags (m-error flags). The set of supported flags (if any) and their semantics are given in the VCR description for that module.

F2 mod_vers: this field is provided to allow software to distinguish different versions of a module. This allows software to take appropriate action if there are differences between module versions.

F3 mod_id: this field is provided to allow software to identify and distinguish different modules.

F4 bot_mb: if this module is associated with one or more data blocks then this value indicates the destination value of the data block with the lowest address. If this module is associated with zero data blocks then this value will be the destination value for the control block of this module.

F5 top_mb: if this module is associated with one or more data blocks then this value indicates the destination value for the data block with the highest address. If this module is associated with zero data blocks then this value will be the destination value for the control block of this module.

TABLE II

| Bit Name | Bit | Size | Volatile? | Synopsis | Type |
|---|---|---|---|---|---|
| err_rcv | 0 | 1 | ✓ | An error response has been received | RW or RES |
| | Operation | | | This bit is set by the module hardware if an error response is received by that module from the packet-router. It indicates that an earlier request from that module was invalid. This bit will be cleared autonomously by hardware only at hard reset. | |
| | When read | | | Returns current value | |
| | When written | | | If this bit is implemented by this module, writes update the current value. If this bit is not implemented by this module, writes are ignored. Software may write to this bit at any time. | |
| | HARD reset | | | 0 | |
| err_snt | 1 | 1 | ✓ | An error response has been sent | RW or RES |
| | Operation | | | This bit is set by the module hardware if an error response is sent by that module to the packet-router. It indicates that an earlier request to that module was invalid. This bit will be cleared autonomously by hardware only at hard reset. | |
| | When read | | | Returns current value | |
| | When written | | | If this bit is implemented by this module, writes update the current value. If this bit is not implemented by this module, writes are ignored. Software may write to this bit at any time. | |
| | HARD reset | | | 0 | |
| bad_addr | 2 | 1 | ✓ | A request for an "UNDEFINED" control register has been received | RW or RES |
| | Operation | | | This bit is set by the module hardware if the module receive a request for an "UNDEFINED" control register. This bit will be cleared autonomously by hardware only at hard reset. | |
| | When read | | | Returns current value | |
| | When written | | | If this bit is implemented by this module, writes update the current value. If this bit is not implemented by this module, writes are ignored. Software may write to this bit at any time. | |
| | HARD reset | | | 0 | |
| unsol_resp | 3 | 1 | ✓ | An unsolicited response has been received | RW or RES |
| | Operation | | | This bit is set by the module hardware if the module detects that it has received an unsolicited response. This bit will be cleared autonomously by hardware only at hard reset. A response is unsolicited if it does not match an outstanding request sent by that module. If a module is incapable of generating requests then all responses to that module are unsolicited. All responses with illegal destinations are routed to the DEBUG where they are signalled as unsolicited responses. It is possible that a module may receive an unsolicited response which is not detected as unsolicited. This will cause that module to exhibit architecturally undefined behaviour. | |
| | When read | | | Software can attempt to clear this flag by writing a zero to it. However, this does not necessarily remove the cause of this error condition. If the error condition persists then this flag will continue to be set until a subsequent hard reset. Returns current value | |
| | When written | | | If this bit is implemented by this module, writes update the current value. If this bit is not implemented by this module, writes are ignored. Software may write to this bit at any time. | |
| | HARD reset | | | 0 | |
| bad_dest | 4 | 1 | ✓ | A request with an illegal destination has been received | RW or RES |
| | Operation | | | This bit is set by the module hardware if a request with an illegal destination is received by that module from the packet-router. This bit will be cleared autonomously by hardware only at hard rest. All requests with illegal destinations are routed to the DEBUG. The DEBUG is the only module that supports this bit. | |
| | When read | | | Returns current value | |
| | When written | | | If this bit is implemented by this module, writes update the current value. If this bit is not implemented by this module, writes are ignored. Software may write to this bit at any time. | |
| | HARD reset | | | 0 | |
| bad_opc | 5 | 1 | ✓ | A request with an unsupported opcode has been received | RW or RES |
| | Operation | | | This bit is set by the module hardware if a request with an unsupported opcode is received by that module from the packet-router. This error can arise because not all modules support all packet-router opcodes. This bit will be cleared autonomously by hardware only at hard reset. | |
| | When read | | | Returns current value | |
| | When written | | | If this bit is implemented by this module, writes update the current value. If this bit is not implemented by this module, writes are ignored. Software may write to this bit at any time. | |
| | HARD reset | | | 0 | |
| — | [6, 7] | 2 | — | RESERVED | RES |
| | Operation | | | RESERVED | |
| | When read | | | Returns 0 | |
| | When written | | | Ignored | |
| | HARD reset | | | 0 | |

The complete set of perr_flags in field F0 is given in Table II.

The perr_flags indicate errors in the interface between that module and the bus 15. Two of these error flags are reserved and always read 0. The remaining six error flags are defined as in Table II, although it is possible for a module to implement some but not all of the flags. If a particular flag is not implemented by a module, then that flag has a reserved behaviour.

After a hard reset of the system, all the perr_flags are 0. Any particular perr_flag can be set to 1 when the associated error condition indicated by the flag arises. This is achieved by the response receiver logic 208 (FIG. 2) which checks the response packets and evaluates for the error conditions defined in Table II. Thus, the following error conditions can be identified by the perr_flags.

An error response has been received by that module from the routing bus 15. This is identified by the response receiver logic 208 and indicated by set error flat 208b in FIG. 2.

The err_snt bit is set if an error response is sent by that module to the routing bus 15. This is indicated by the error response generator logic 204 in FIG. 2.

The bad_addr bit is set if a request has been received for an undefined control register. This is monitored at the request receiver logic 206. The check request valid block 206a will determine that the request is not valid and trigger the error response generator logic to generate an error response packet and to set the flag. This is denoted at 204b.

The unsol_rest bis is set if an unsolicited response has been received. This is monitored by the response receiver logic 208 and the check response block 208a. If the response cannot be matched with an initiating request, this error flag is set as indicated at 208d.

The bad_dest flag is set if a request with an illegal destination is received. This monitored by the request receiver logic 206.

The bad-opc error flag is set if a request with unsupported opcode is received. This is also monitored by the request receiver logic 206.

In addition, software can read and write to the flags using the LoadWord and StoreWord transactions as indicated earlier. It will be appreciated in this respect that the flags can be read or written either from the on-chip CPUs, or from the off-chip host CPU 60.

It is possible for more than one flag to be set to indicate multiple error conditions.

The merr_flags indicate errors specific to the module. If a module does not implement a particular merr_flag, then that flag has reserved behaviour. All merr_flags are 0 after a hard reset of the system. Merr_flags can be set to 1 by hardware within the module whenever the associated error condition arises. This is indicated for example in the EMI module 32 as error hardware 8 and it will be appreciated that appropriate error hardware is provided at each module.

The memory mapped organisation described above with reference to FIG. 5 allows software to scan through it to locate control blocks and data blocks, amongst other things for diagnostic purposes. Appropriate software can be executed either on an on-chip CPU 12, 13 or on a host CPU 60 accessing the chip via the debug module 30 and its link 31.

The scanning algorithm scans downwards through the memory map reading 8 byte words from addresses aligned to $2^{24}$ bytes.

This scan should start at the highest address aligned to $2^{24}$ i.e. 0xFF000000. The bot_mb and top_mb information in the VCR of each control block is used to ensure that data blocks are skipped over in the scanning sequence. It is important to ensure that data blocks are not read from, since data blocks may correspond to areas of data that have to be configured carefully and to address space that is implemented using off-chip state. It is possible that reads from off-chip state could modify the state of external memory mapped peripherals.

Each 8 byte word that is read will be to the first 8 byte word in a memory block. If the access is to an undefined block then the access is to an illegal destination address. This will cause the following behaviour.

In the following a naming protocol for the version control registers is adhered to in which the left-most sub-name indicate the module that implements a control register and subsequent fields and bits are separated from the control register name by a period. Thus for example the first bit referred to as DEBUG.VCR.perr_flags.bad_addr is the bad address error bit in the perr_flag field F0 of the version control register associated with the debug module 30.

DEBUG.VCR.perr_flags.bad_addr will be set since the access will cause a request to an illegal destination to be sent to the DEBUG module 30.

DEBUG.VCR.perr_flags.err_snt will be set since the access will cause an error response to be returned by the DEBUG module 30.

If the access is made by an on-chip CPU, then the VCR of the CPU will have VCR.perr_flags.err_rcv set since the error response will be received by that CPU. If the access is made by the host, then the host will be returned an error response over the debug link 31.

If the access is made by an on-chip CPU, then the value loaded by the instruction causing that access will be undefined.

If the access is to a control block then the access will return the value of the VCR for that control block without setting any error bit nor generating an error response.

These different behaviours can be used to distinguish accesses to an undefined block from accesses to a control block. The scanning algorithm detects data blocks through the VCR values bot_mb, top_mb of control blocks. The scanning algorithm itself makes no accesses to locations within data blocks.

The value of this simple scan is that a scan of the memory can be achieved in a safe manner with accesses that do not cause major changes to the architectural state of the system. It allows each memory block to be classified as a control block, a data block or an undefined block. Since each version control register contains a module identity and a module version (fields F2 and F3 in FIG. 6), it is possible for software to check for the presence of particular modules and to handle different module versions appropriately.

Likewise, the version control registers are accessible by software running on the host CPU 60 or the on-chip CPU. If a debugging routine is running on the host CPU 60, the version control registers facilitate efficient postmortem debugging. Following the execution of a piece of code which contains bugs, the debugging routine can examine the version control register of each module in turn and determine which if any of them received a bad transaction and from where such a transaction was received. In addition, if required, development system software can monitor and display on the host CPU 60 the complete set of version control registers using a memory mapped debug link thus enabling interactive debugging.

Table III gives an example of how a number of the modules illustrated in FIG. 1 can be memory mapped with their control blocks, data blocks and version control register parameters.

TABLE III

| MODULE | CB | MOD_VERS | MOD_ID | BOT_MB | TOP_MB |
|---|---|---|---|---|---|
| PERIPH | 0x04 | 0x0000 | 0x2001 | 0x00 | 0x03 |
| DEBUG | 0x06 | 0x0000 | 0x2002 | 0x05 | 0x05 |
| CPU | 0x07 | 0x0000 | 0x2003 | 0x07 | 0x07 |
| DMAC | 0x08 | 0x0000 | 0x2004 | 0x08 | 0x08 |
| CLOCK | 0.09 | 0x0000 | 0x2005 | 0x09 | 0x09 |

TABLE III-continued

| MODULE | CB | MOD_VERS | MOD_ID | BOT_MB | TOP_MB |
|---|---|---|---|---|---|
| PCH | 0x7F | 0x0000 | 0x2006 | 0x40 | 0.7E |
| EMI | 0xFF | 0x0000 | 0x2007 | 0x80 | 0xFE |

What is claimed is:

1. A integrated circuit comprising:
plurality of functional modules interconnected via an on-chip communication path, each functional module having packet handling circuitry for generating and receiving packets conveyed by the communication path,
wherein each functional module is associated with an error monitoring register for monitoring error conditions and wherein the packet handling circuitry includes error detection logic for detecting an error condition and flagging the error condition in the error monitoring register.

2. An integrated circuit according to claim 1, wherein each error monitoring register contains a set of communication error flags, each of which can be set by said error detection logic.

3. An integrated circuit according to claim 1, wherein the packets conveyed by the communication path include memory access request packets and response packets.

4. An integrated circuit according to claim 3, wherein the packet handling circuitry is operable to generate ordinary response packets in the case that a valid memory access request has been received, and error response packets in the case that an invalid memory access request has been received.

5. An integrated circuit according to claim 4, wherein the error detection logic includes means for detecting that an error response packet has been received and means for setting an error response received communication error flag in the error monitoring register.

6. An integrated circuit according to claim 4, wherein the error detection logic comprises means for detecting that an error response packet has been generated, and means for setting an error response sent communication error flag in the error monitoring register.

7. An integrated circuit according to claim 3, wherein each of said error condition flags can be read or written by said memory access request packets.

8. An integrated circuit according to claim 3, wherein the error detection logic comprises means for monitoring the receipt of request packets and means for setting one or more communication error flags in the error monitoring register if errors are detected in the request packets.

9. An integrated circuit according to claim 3, wherein the error detection logic comprises means for determining that an unsolicited response packet has been received at a functional module and means for setting an unsolicited response communication error flag in the error monitoring register.

10. An integrated circuit according to claim 1, wherein the error monitoring registers form part of a common memory space for the integrated circuit, said memory space including a plurality of control blocks associated respectively with the functional modules.

11. An integrated circuit according to claim 10, wherein each control block comprises a plurality of control registers, including said error monitoring register implemented as memory at the respective functional block.

12. An integrated circuit according to claim 1, wherein one of said functional modules provides an off-chip communication link connectable to a host computer.

13. A computer system comprising an integrated circuit according to claim 1 and a host computer connected to the integrated circuit via an off-chip link provided by one of said functional modules, said host computer being operable to execute a diagnostic routine, wherein each error monitoring register is responsive to a read request from the host computer to return the condition of the error flags for diagnostic purposes.

14. A functional module having an interface for connection to a packet router, the functional module having packet handling circuitry for generating and receiving packets conveyed by the packet router across said interface, wherein the packet handling circuitry includes error detection logic for detecting an error condition in packets conveyed by the packet router and setting one or more of a set of communication error flags in an error monitoring register implemented at the functional module.

15. A functional module according to claim 14, wherein the packet handling circuitry includes means for generating memory access request packets.

16. A functional module according to claim 15, wherein the packet handling circuitry comprises means for generating ordinary response packets when a valid memory access request is received and error response packets when an invalid memory access request is received, said response packets being directed to a source of the memory access request packets via the packet router.

17. A functional module according to claim 16, wherein the error detection logic comprises means for setting a first communication error flag to denote that an error response has been generated.

18. A functional module according to claim 16, wherein the error detection logic comprises means for setting a second communication error flag in the case that an error response packet has been received.

19. A functional module according to claim 16, wherein the error detection logic comprises means for monitoring the receipt of an unsolicited response packet and means for setting a third communication error flag if that condition is detected.

20. A functional module according to claim 15, wherein the error detection logic comprises means for monitoring memory access request packets and means for setting one or more communication error flags in the case that errors exist in said request packets.

21. A method of monitoring errors arising in the transmission of packets conveyed by a packet router interconnecting a plurality of functional modules wherein each functional module has packet handling circuitry for generating and receiving packets, the method comprising:
at each functional module, monitoring the receipt of packets conveyed by the packet router to that functional module;
determining the nature of the received packet amongst the group of packet types including a memory access request packet, an ordinary response packet and an error response packet; and
in the case of receipt of an error response packet, setting a communication error flag at the functional module to denote that an error response packet has been received.

* * * * *